US006310535B2

(12) United States Patent
Kuratani

(10) Patent No.: US 6,310,535 B2
(45) Date of Patent: Oct. 30, 2001

(54) ROTARY ELECTRIC PART SUPERIOR IN CLICK FEELING

(75) Inventor: Junichi Kuratani, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/794,563

(22) Filed: Feb. 27, 2001

(30) Foreign Application Priority Data

Mar. 1, 2000 (JP) ..................................................... 12-060364

(51) Int. Cl.[7] ..................................................... H01L 10/32

(52) U.S. Cl. ........................ 338/162; 338/190; 200/11 R; 200/11 G

(58) Field of Search ..................................... 338/162, 190; 200/11 R, 11 G

(56) References Cited

U.S. PATENT DOCUMENTS 3,300,594 * 1/1967 Paine .................................... 338/162
4,145,585 3/1979 Iwasaki .
4,504,706 * 3/1985 Watanabe et al. ................. 200/11 R
4,894,494 * 1/1990 Rosl et al. ......................... 200/11 R
5,546,067 * 8/1996 Schmidt et al. ..................... 338/162
6,028,502 * 2/2000 McSwiggen ......................... 338/162

FOREIGN PATENT DOCUMENTS

Hei 9-219133 8/1997 (JP) .

* cited by examiner

*Primary Examiner*—Karl D. Easthom
(74) *Attorney, Agent, or Firm*—Brinks Hofer Gilson & Lione

(57) ABSTRACT

In a click structure of a rotary electric part according to the present invention, a click member and a biasing member are formed as separate members, so the resilience of the biasing member is not affected by the heat generated during molding; besides, the spring span of the biasing member can be made long, thus ensuring a satisfactory resilience over a long period. The rotary electric part. Long-term durability, good click feeling and reduced noise are also characteristic features of the rotary electric part of the invention.

8 Claims, 16 Drawing Sheets

FIG. 32 PRIOR ART
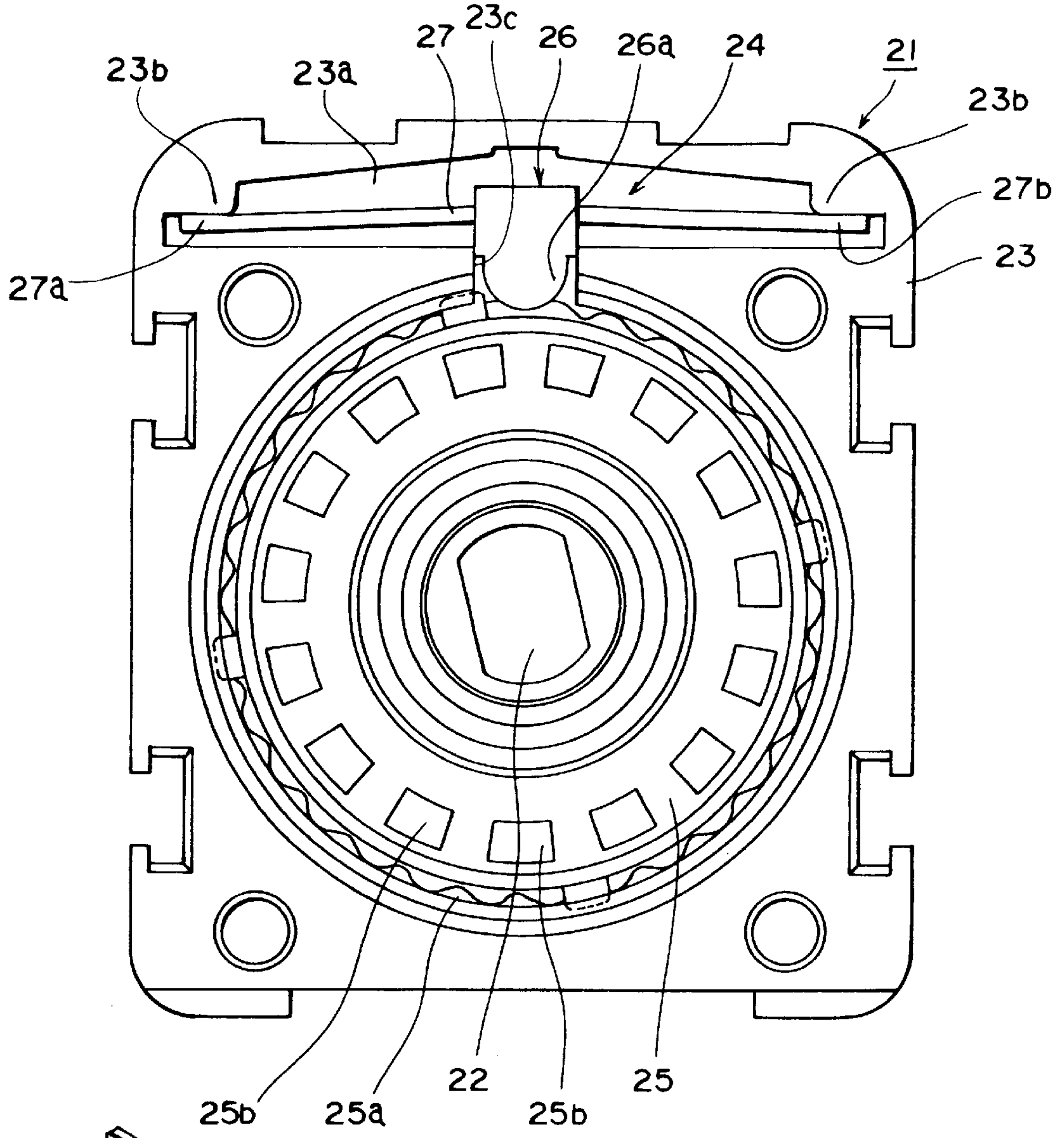
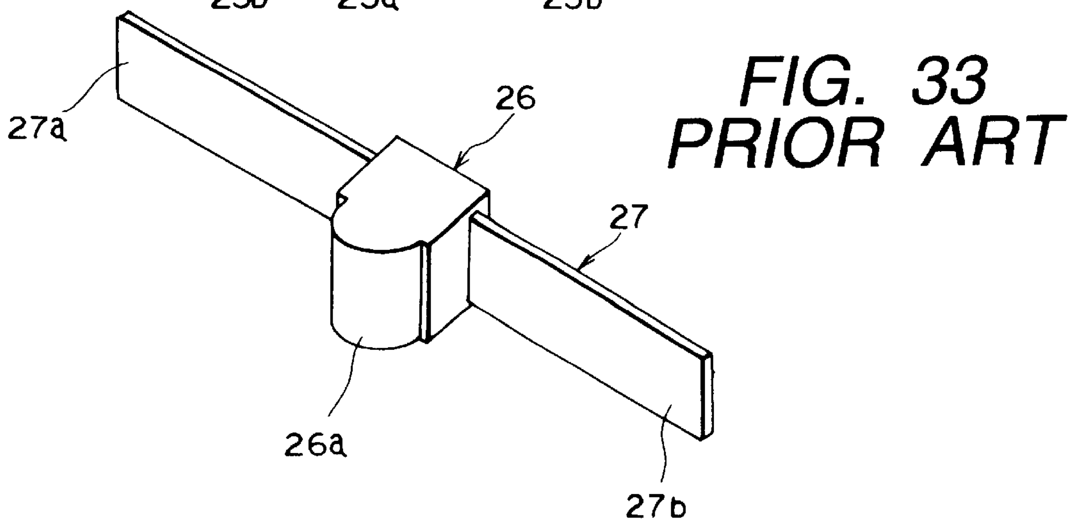
FIG. 33 PRIOR ART

ROTARY ELECTRIC PART SUPERIOR IN CLICK FEELING

BACKGROUND OF THE INVENTION

1. Field of the Invention

The present invention relates to a rotary electric part with click for use in a vehicular air conditioner for example.

2. Description of the Prior Art

The structure of a conventional rotary electric part with click will now be described with reference to FIGS. 32 and 33. A rotary electric part 21 has a rotary shaft 22 with a knob (not shown) attached to one end thereof and which causes the rotary electric part 21 to rotate, a metallic bearing 23 which supports the rotary shaft 22 rotatably, and a click mechanism 24 disposed within the bearing 23 to impart a click feeling to the rotary shaft 22.

The click mechanism 24 is formed in a generally disc shape and is made up of a rotary disc 25 which is rotatable together with the rotary shaft 22, a click member 26 which engages an outer circumference portion of the rotary disc 25, and a metallic spring plate 27 supported at both ends thereof by the bearing 23 and which imparts an elastic force to the click member 26, the elastic force acting toward the rotary disc 25.

On the outer circumference portion of the rotary disc 25 are formed a plurality of concaves and convexes 25*a* continuously at predetermined spaced positions, and on one side of the rotary disc 25 are formed a plurality of patterns 25*b* which are arranged in synchronism with the concaves and convexes 25*a*.

The click member 26 is integrally formed centrally of the spring plate 27 by outsert molding of a synthetic resin and has a semi-cylindrical portion 26*a* which comes into abutment with the concaves and convexes 25*a* formed on the outer circumference portion of the rotary disc 25.

Both end portions 27*a* and 27*b* of the spring plate 27 come into abutment against shoulder portions 23*b* of a recess 23*a* formed in the bearing 23 to urge the click member 26 elastically in a direction in which the click member is put in pressure contact with the outer circumference portion of the rotary disc 25. The click member 26 is positioned within a concave portion 23*c* formed in the bearing 23 and is adapted to move while being guided by a pair of side walls of the concave portion 23*c*.

In the rotary electric part 21 having such a construction, when an operator operates the rotary shaft 22 for rotation, the rotary disc 25 rotates integrally with the rotary shaft and the semi-cylindrical portion 26*a* of the click member 26 slides on the outer circumference portion of the rotary disc 25.

At this time, since the click member 26 is urged elastically by the spring plate 27 in a direction in which it comes into pressure contact with the outer circumference portion of the rotary disc 25, the operating force required for rotation of the rotary shaft 22 varies as the semicylindrical portion 26*a* engages and disengages from the concaves and convexes 25*a* successively, whereby the operator comes to have a click feeling through the rotary shaft 22.

While the click member 26 moves following the concaves and convexes 25*a*, the spring plate 27 repeats deflection, so that both end portions 27*a* and 27*b* of the spring plate slide on the shoulder portions 23*b* of the metallic bearing 23 and induce a vibrational shock between them and the shoulder portions, generating a loud noise.

With rotation of the rotary disc 25, the patterns 25*b* come into sliding contact with fixed contact pieces (not shown) to effect change-over of contacts.

In the conventional rotary electric part, since the click member 26 and the spring plate 27 are formed integrally by a forming work, the resilience of the spring plate 27 may be impaired due to heat generated during the formation or the length of the click member 26 obstructs taking a long spring span of the spring plate 27.

Moreover, since the click member 26 is guided by only a pair of side walls of the concave portion 23*c*, the click member 26 wobbles largely in the rotational direction of the rotary disc 25 at the time of engagement with and disengagement from the concaves and convexes 25*a*, thus resulting in that the click feeling becomes worse.

Further, since both end portions 27*a* and 27*b* of the spring plate 27 with the click members 26 secured thereto for engagement with and disengagement from the concaves and convexes 25*a* come into abutment against the shoulder portions 23*b* of the metallic bearing 23, the spring plate 27 repeats deflection while the click member 26 moves following the concaves and convexes 25*a*. Consequently, both end portions 27*a* and 27*b* of the spring plate 27 slide on the shoulder portions 23*b* of the metallic bearing 23 and induce a vibrational shock between them and the shoulder portions 23*b*, producing a loud noise.

SUMMARY OF THE INVENTION

Accordingly, it is an object of the present invention to provide a rotary electric part capable of withstanding a long-term use without impairment in the resilience of a biasing member used, affording a good click feeling, and reduced in noise.

According to the first means adopted by the invention for solving the above-mentioned problems there is provided a rotary electric part comprising a rotary member having a plurality of concaves and convexes, a click member for engagement with and disengagement from the concaves and convexes, a biasing member for urging the click member elastically in a direction in which the click member comes into pressure contact with the concaves and convexes, and a holding member for holding the biasing member, the click member coming into engagement with and disengagement from the concaves and convexes with rotation of the rotary member and creating a click feeling, wherein the click member and the biasing member are formed as separate members, the click member has a body for engagement with and disengagement from the concaves and convexes and also has a convex portion which is integral with the body in a direction perpendicular to a moving direction of the body, the body of the click member is guided by side walls of a concave portion formed in the holding member, and the convex portion is guided by a concave groove.

According to the second means for solution adopted by the invention there is provided, in combination with the first means, a rotary electric part wherein the convex portion of the click member is formed at a rear portion of the body on the side opposite to a front portion of the body which comes into engagement with and disengagement from the concaves and convexes.

According to the third means for solution adopted by the invention there is provided, in combination with the second means, a rotary electric part wherein the convex portion of the click member is formed so as to project at least partially from an end of the rear portion of the body.

According to the fourth means for solution adopted by the invention there is provided, in combination with the first means, a rotary electric part wherein the front portion of the body of the click member is formed to have a width larger than the width of the rear portion of the body and is guided by the side walls of the concave portion, and an end of the rear portion smaller in width is urged by the biasing member.

According to the fifth means for solution adopted by the invention there is provided, in combination with the fourth means, a rotary electric part wherein an end of the front portion of the body in the click member is formed as an arcuate surface having a radius larger than that of the rear portion of the body, while an end of the rear portion is formed as an arcuate surface having a radius smaller than that of the front portion.

According to the sixth means for solution adopted by the invention there is provided, in combination with the first means, a rotary electric part wherein the click member and the holding member are formed of synthetic resin.

According to the seventh means for solution adopted by the invention there is provided, in combination with the first means, a rotary electric part wherein the biasing member is formed by a metallic plate spring.

According to the eighth means for solution adopted by the invention there is provided, in combination with the first means, a rotary electric part wherein the concaves and convexes are formed on an outer circumference portion of the rotary member, the holding member is constituted by a housing, and the click member is held grippingly between the housing and the rotary member.

BRIEF DESCRIPTION OF THE DRAWINGS

FIG. 32 is a rear view of a click structure of a conventional rotary electric part; and FIG. 33 is a perspective view of a spring plate and an engaging member both used in the conventional click structure.

DETAILED DESCRIPTION OF THE PREFERRED EMBODIMENT

Figure 1:
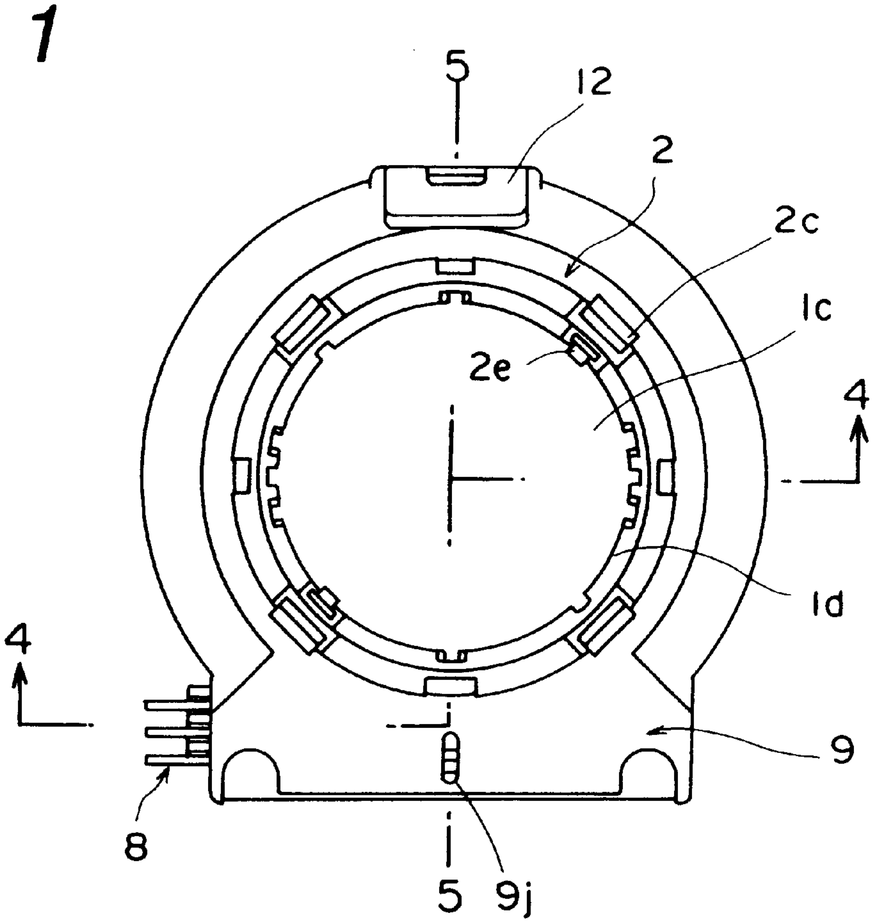
FIG. 1 is a plan view of a click structure of a rotary electric part embodying the present invention.
Figure 2:
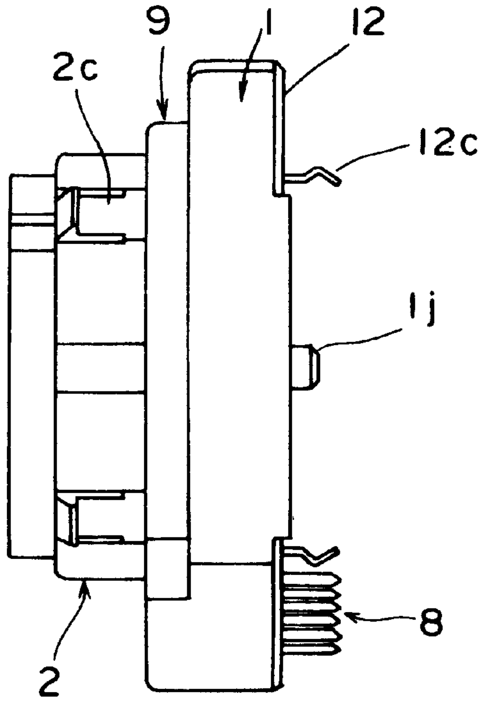
FIG. 2 is a side view thereof.
Figure 3:
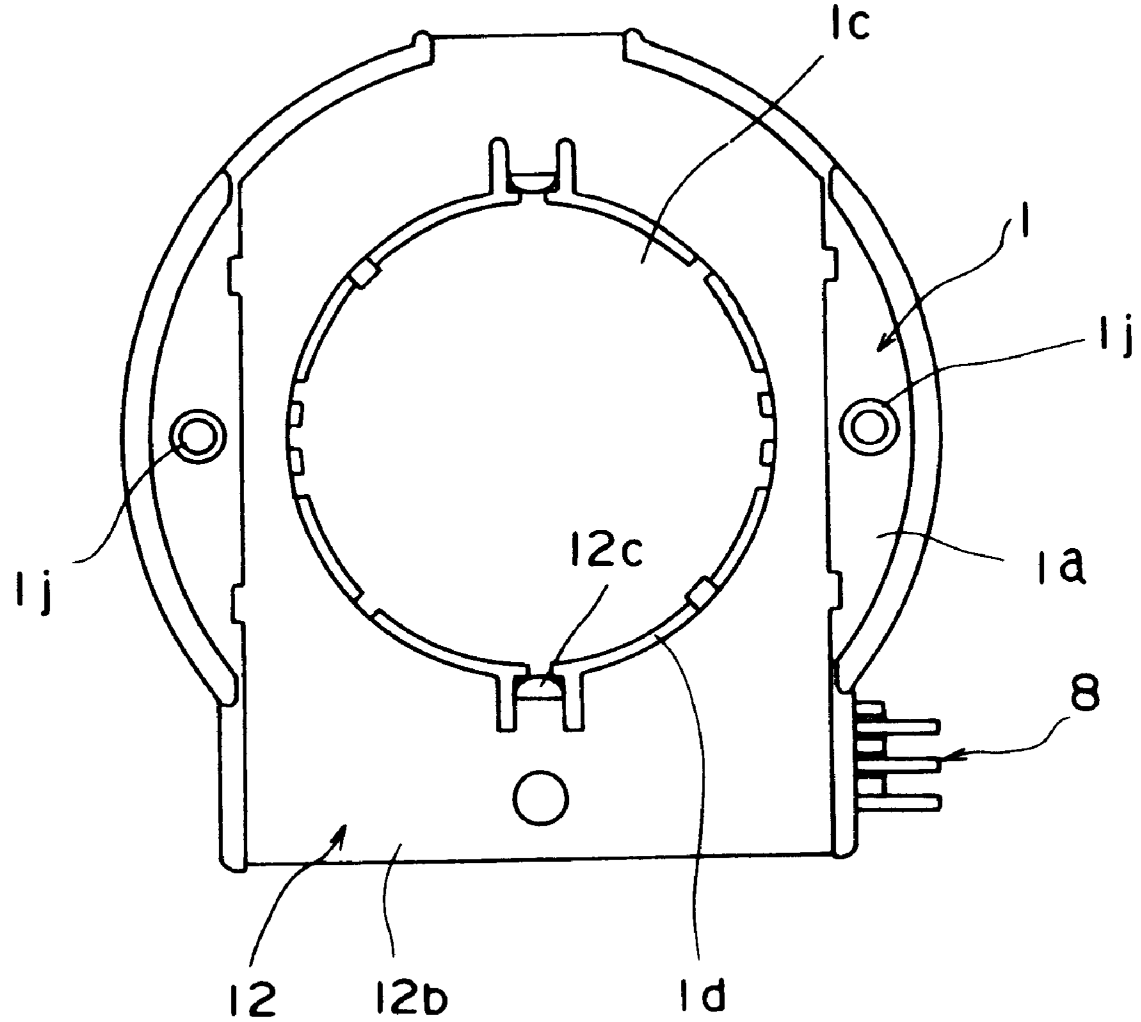
FIG. 3 is a bottom view thereof.

The construction of the rotary electric part embodying the present invention will now be described with reference to FIGS. 1 to 31. As shown particularly in FIG. 9 and FIGS. 10 to 12, a case 1, which is formed by molding a synthetic resin, comprises a flat plate-like wall portion 1*a* formed in a generally horseshoe shape by both an arcuate portion and a generally rectangular portion, a side wall 1*b* erected upright from an outer periphery of the wall portion 1*a* exclusive of a part thereof, a cylindrical support portion 1*d* formed along an inner periphery of the wall portion 1*a* and having a through hole 1*c*, a plurality of snap leg portions le formed on a free end side of the support portion 1*d* and with retaining pawls positioned on the through hole 1*c* side, and ribs 1*f* formed by a combination of arcuate ribs and radial ribs on the wall portion 1*a* located between the side wall 1*b* and the support portion 1*d*.

The case 1 has a receptacle portion 1*g* formed in a generally rectangular space of the wall portion 1*a*, a plurality of projections 1*h* formed on the wall portion 1*a* positioned in the receptacle portion 1*g*, and a positioning convex portion 1*j* formed on the exterior of the wall portion 1*a*. In the case 1, the portions surrounded with the ribs 1*f* (hatching portions in the figure) are formed thin. By forming such thin-walled portions, not only the material cost is reduced, but also sink after formation is diminished to improve the dimensional accuracy.

As shown particularly in FIG. 9 and FIGS. 13 to 16, a shaft member 2, which is formed by molding a synthetic resin, has a cylindrical shoulder portion 2*a* formed at an axially intermediate position of an outer periphery of the shaft member and extending radially, a plurality (three or more) of first snap leg portions 2*b* formed on one axial end side with the shoulder portion 2*a* as a boundary and having retaining pawls positioned outside, a plurality of second snap leg portions 2*c* formed on the axially opposite side with the shoulder portion 2*a* as a boundary at positions different from the first snap leg portions 2*b*, the second snap leg portions 2*c* having retaining pawls positioned outside, and stepped portions 2*g* formed at one end of the shaft member 2.

The cylindrical support portion 1*d* of the case 1 is inserted into the cylindrical interior of the shaft member 2, which shaft member is rotatable with a support portion 1*d* as a shaft.

In this case, the axially extending first snap leg portions 2*b* are opposed in proximity to an outer peripheral surface of the support portion 1*d*.

A rotary member 3 comprises a rotor 4 formed by molding a synthetic resin and an insulating substrate 5 combined with the rotor 4.

The rotor 4 and the insulating substrate 5 may be formed integrally by molding a synthetic resin.

As shown in FIG. 9 and FIGS. 17 to 20, the rotor 4 comprises a cylindrical portion 4*a*, a flange portion 4*b* formed at an axially intermediate position of an outer periphery of the cylindrical portion 4*a* and extending radially, a fan-shaped stopper portion 4*c* further projecting from the flange portion 4*b*, a concave-convex portion 4*d* comprising plural concaves and convexes and formed on an outer circumference of the cylindrical portion 4*a* of a larger diameter located on one side with the flange portion 4*b* as a boundary, a plurality of slots 4*e* formed axially in the cylindrical portion 4*a* of a smaller diameter located on the opposite side with the flange portion 4*b* as a boundary, a protrusion 4*f* formed at a position where the flange portion 4*b* and the stopper portion 4*c* overlap each other, and arcuate stepped portions 4*g* formed on both sides of the slots 4*e* in the interior of the cylindrical portion.

Figure 9:
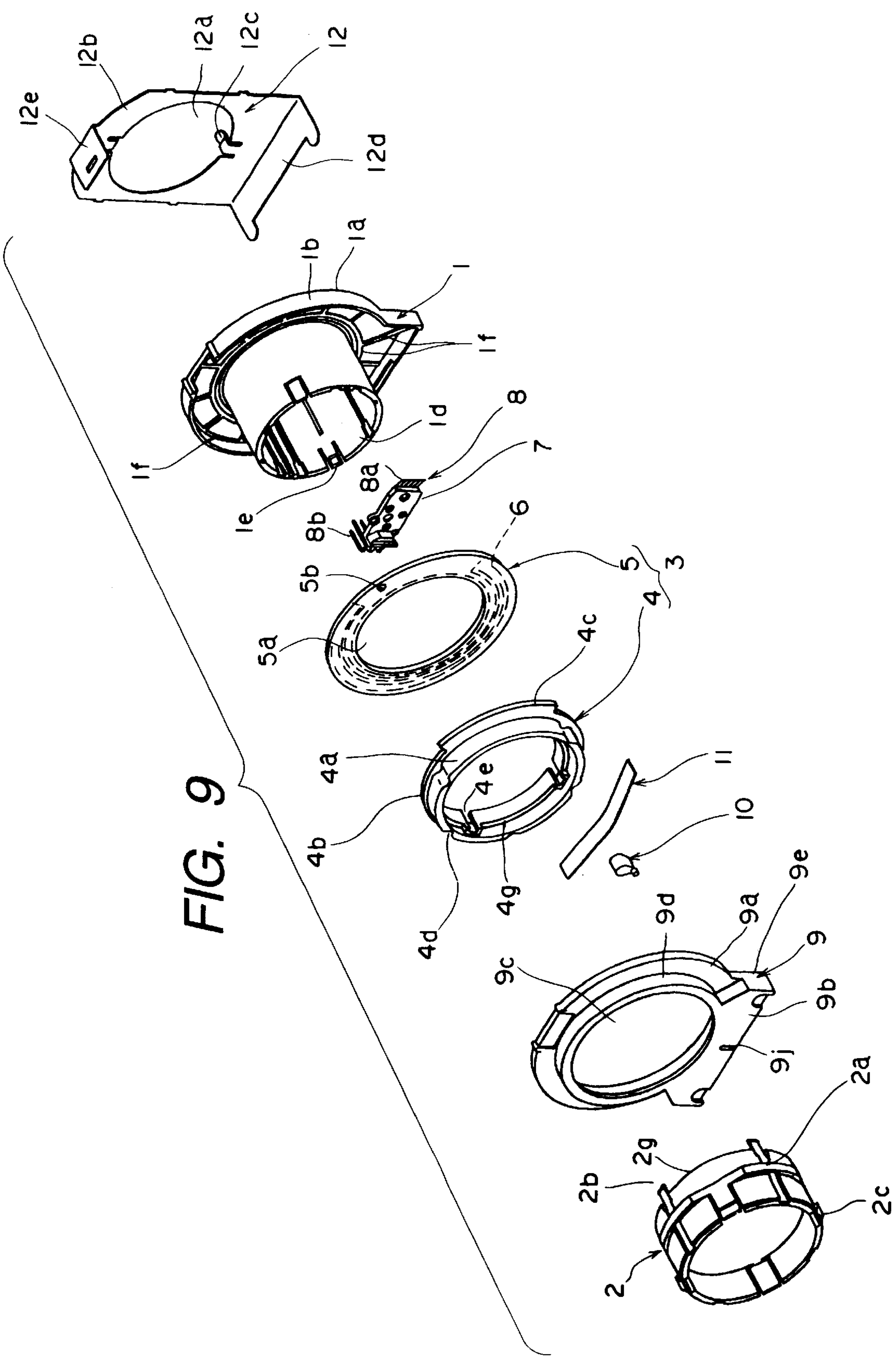
FIG. 9 is an exploded perspective view of the click structure.
Figure 10:
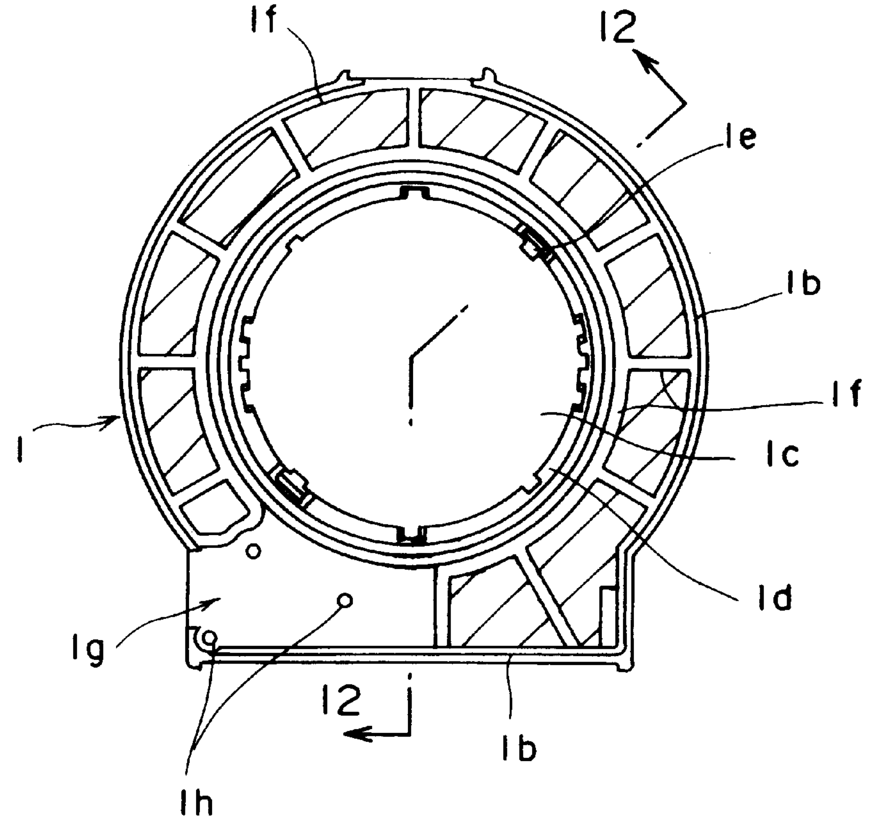
FIG. 10 is a plan view of a case used in the click structure.
Figure 11:
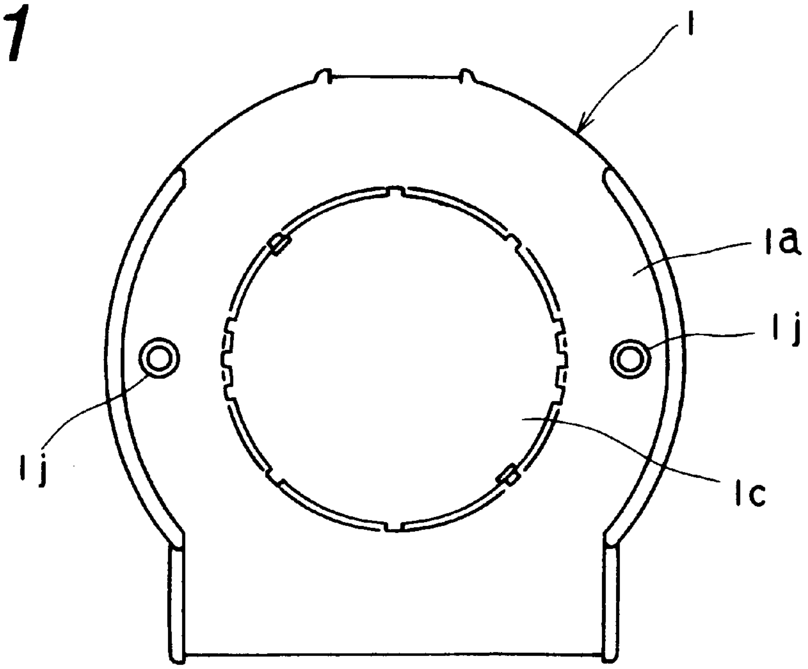
FIG. 11 is a bottom view of the case.
Figure 12:
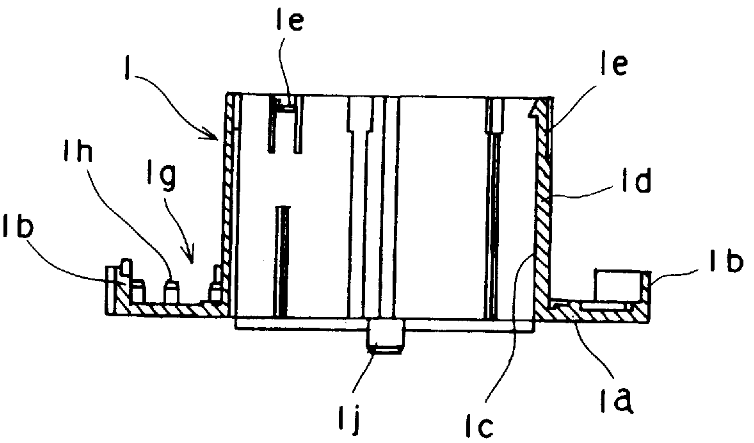
FIG. 12 is a sectional view taken on line 12—12 in FIG. 10.
Figure 13:
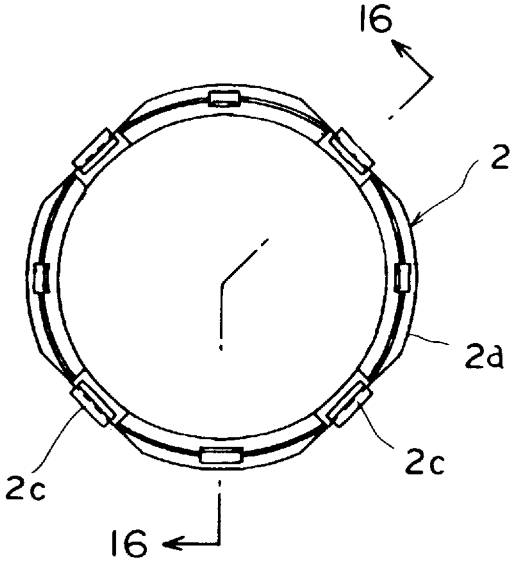
FIG. 13 is a plan view of a shaft member used in the click structure.
Figure 14:
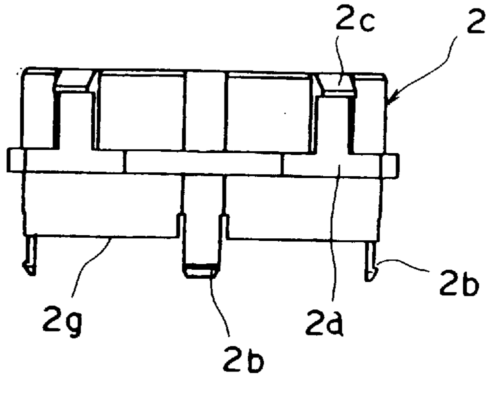
FIG. 14 is a front view of the shaft member.
Figure 15:
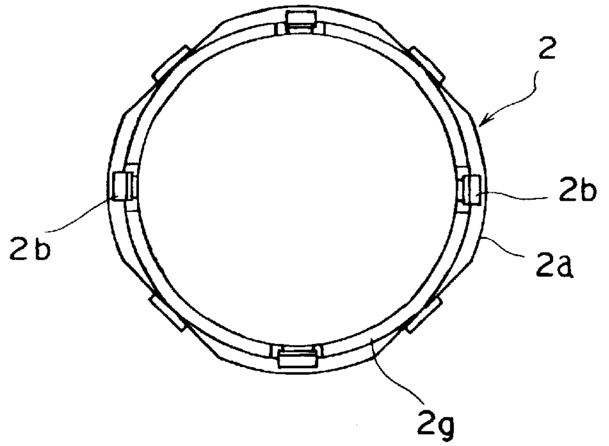
FIG. 15 is a bottom view of the shaft member.
Figure 16:
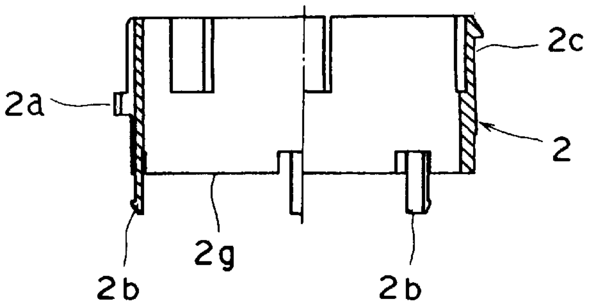
FIG. 16 is a sectional view taken on line 16—16 in FIG. 13.
Figure 17:
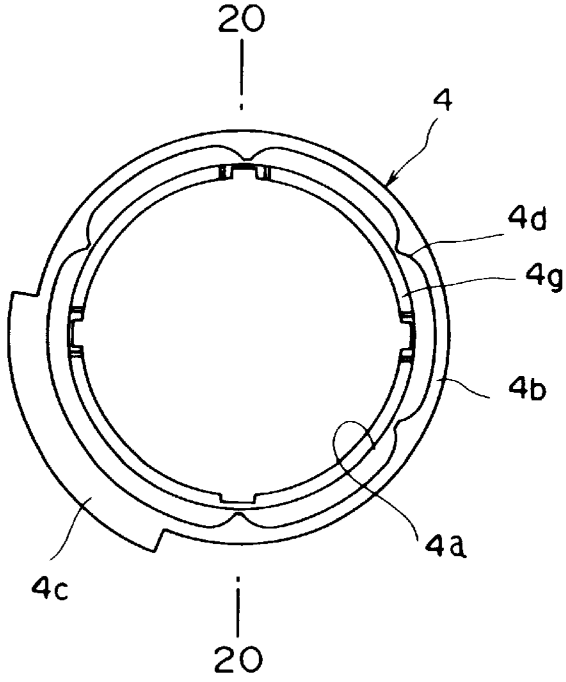
FIG. 17 is a plan view of a rotor used in the click structure.
Figure 18:
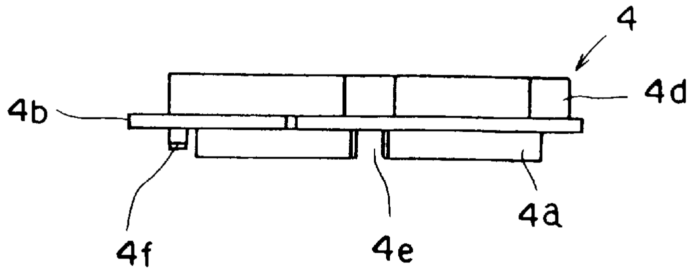
FIG. 18 is a front view of the rotor.
Figure 19:
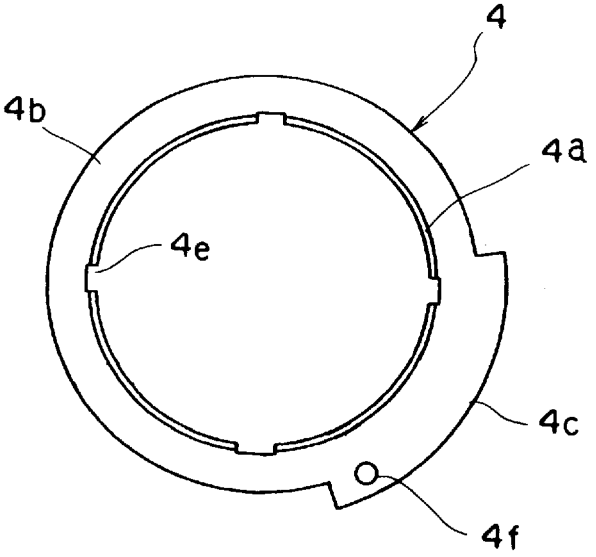
FIG. 19 is a bottom view of the rotor.
Figure 20:
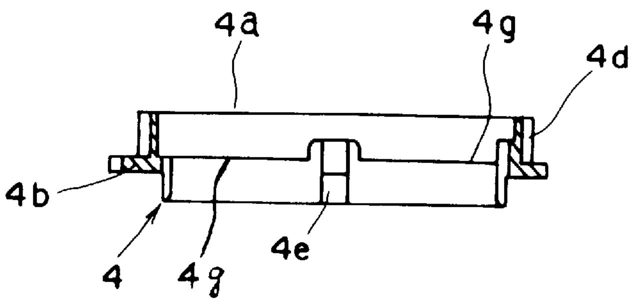
FIG. 20 is a sectional view taken on line 20—20 in FIG. 17.

As shown particularly in FIG. 9, the insulating substrate 5 is formed in the shape of a ring and has a large central hole 5*a* and a small hole 5*b* formed in an outer periphery of the substrate. On one side of the insulating substrate 5 is formed a conductive pattern 6 which is, for example, a code pattern of a conductor.

The cylindrical portion 4*a* of a smaller diameter located on the opposite side of the rotor 4 is inserted through the hole 5*a* of the insulating substrate 5 and the protrusion 4*f* is fitted in the hole 5*b*. In this state, on the side free of the conductive pattern 6 the insulating substrate 5 is superimposed on one sides of the flange portion 4*b* and the stopper portion 4*c*.

At this time, the concave-convex portion of the rotor 4 is positioned inside the contour of the insulating substrate 5.

In this way the insulating substrate 5 is superimposed on the flange portion 4*b*, the cylindrical portion 4*a* is inserted through the hole 5*a*, the protrusion 4*f* is inserted through the hole 5*b*, and thus the rotor 4 and the insulating substrate 5 are established their position in the plate surface direction. After the rotary member 3 is thus assembled, the shaft member 2 is inserted into the cylindrical portion 4*a* of the rotor 4, the first snap leg portions 2*b* pass through the slots 4*e* and are engaged with the insulating substrate 5 (snap-fastened to the substrate on the side where the conductive pattern 6 is formed), and the rotary member 3 is combined with the shaft member 2 and can rotate together with the shaft member.

At this time, the stepped portions 2*g* of the shaft member 2 come into abutment against the stepped portions 4*g* of the rotor 4 and the rotary member 3 is held grippingly by both the stepped portions 2*g* and the first snap leg portions 2*b*.

With the shaft member 2 mounted to the case 1, the insulating substrate 5, on its side where the conductive pattern 6 is formed, is in close proximity to the ribs 1*f*.

Figure 4:
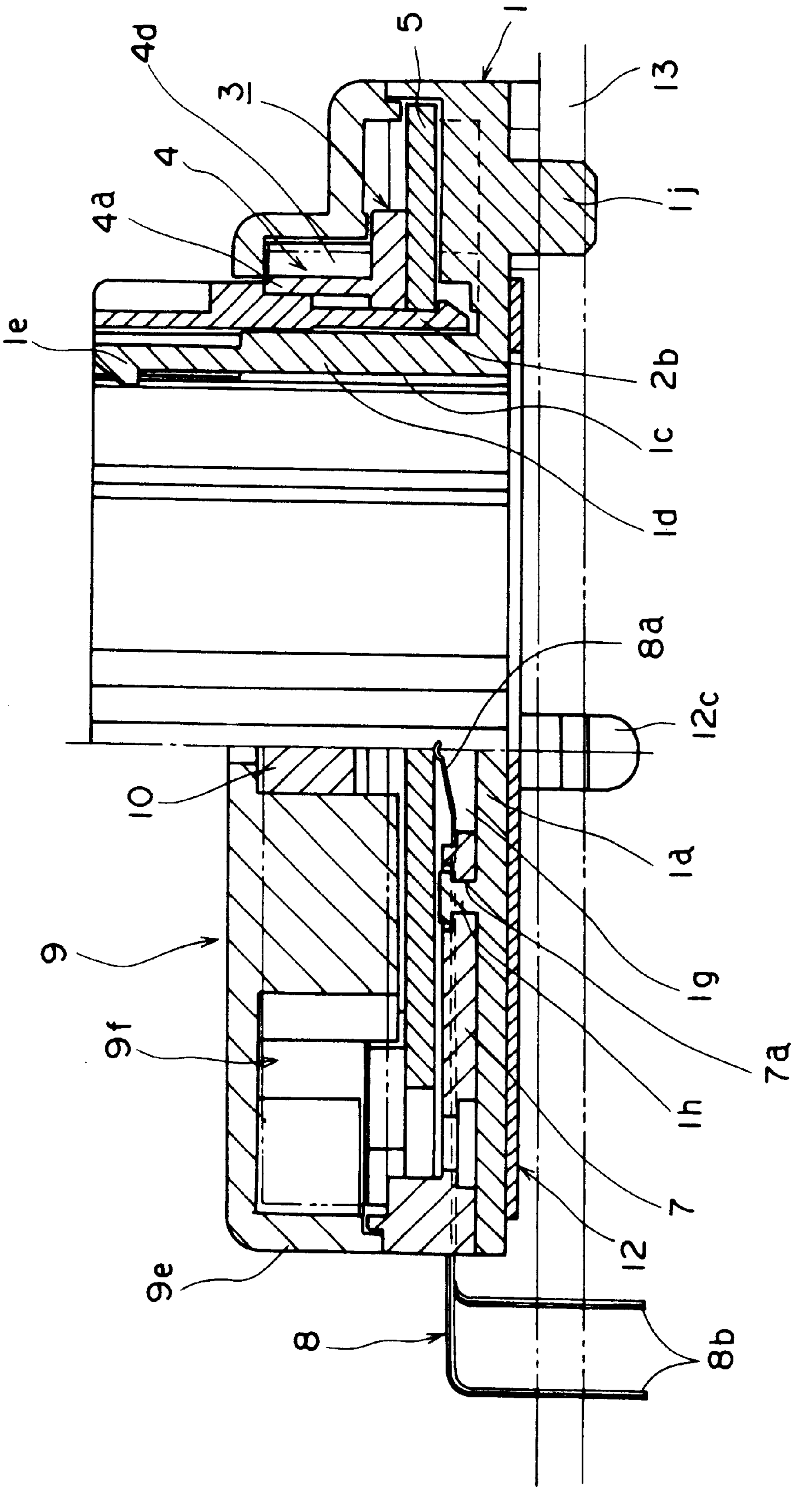
FIG. 4 is a sectional view taken on line 4—4 in FIG. 1.
Figure 5:
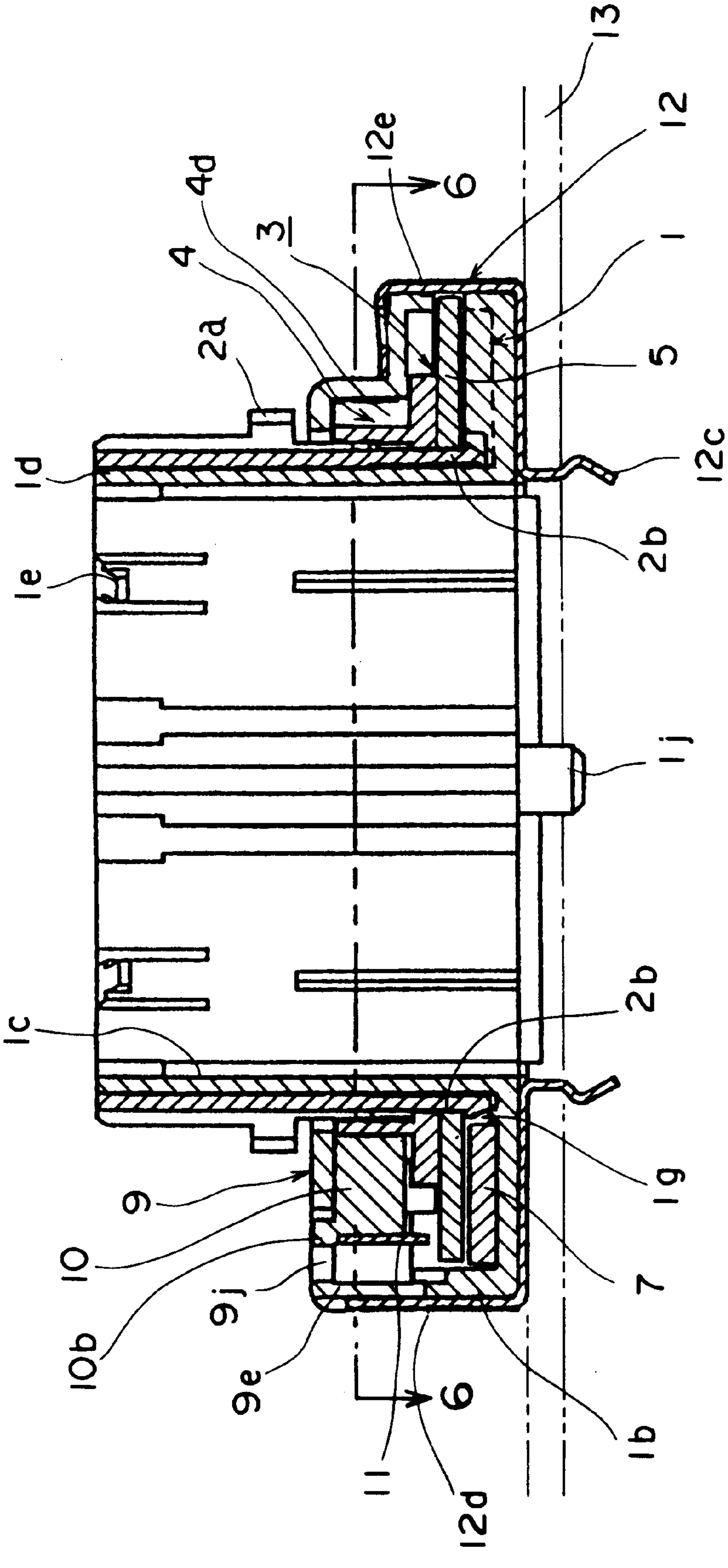
FIG. 5 is a sectional view taken on line 5—5 in FIG. 1.
Figure 6:
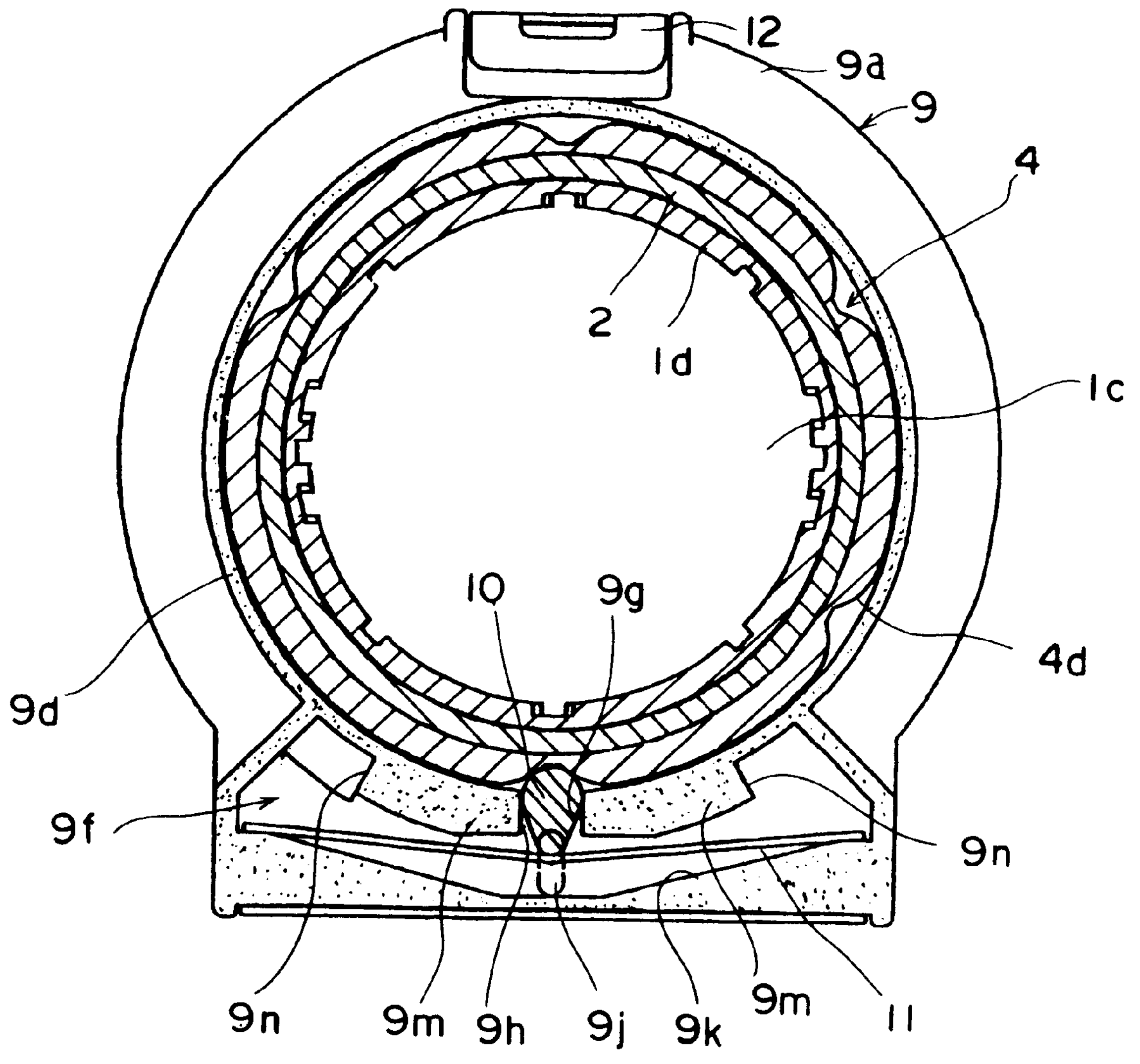
FIG. 6 is a sectional view taken on line 6—6 in FIG. 5.

As is seen from FIG. 4 or FIG. 5, the snap leg portions 2*b* are formed at a rather lower position so as to form a slight clearance between them and the support portion 1*d*.

Since the clearance is a slight clearance, even if the snap leg portions 2*b* are deflected inwards, they come into abutment against the support portion 1*d* and are thereby prevented from being disengaged from the insulating substrate 5.

Figure 21:
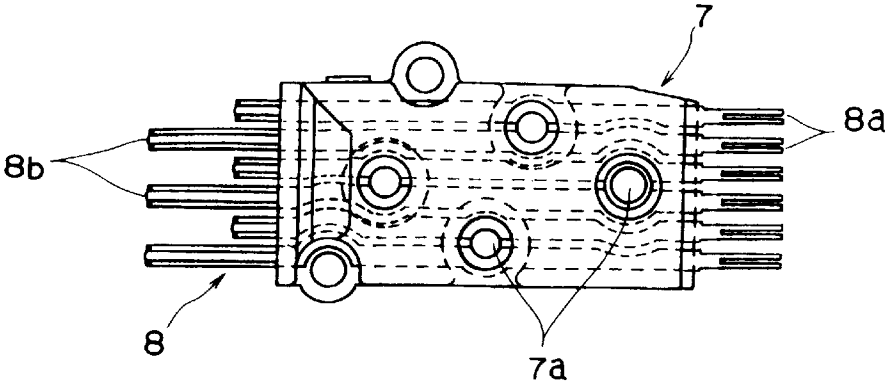
FIG. 21 is a plan view of an insulating substrate used in the click structure.
Figure 22:
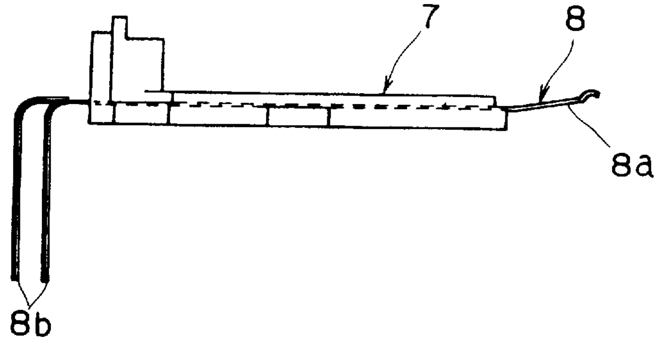
FIG. 22 is a front view of the insulating substrate.
Figure 23:
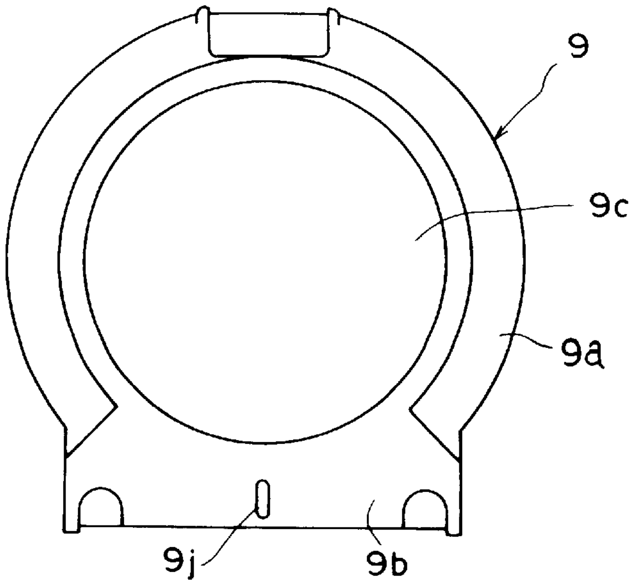
FIG. 23 is a plan view of a housing used in the click structure.
Figure 24:
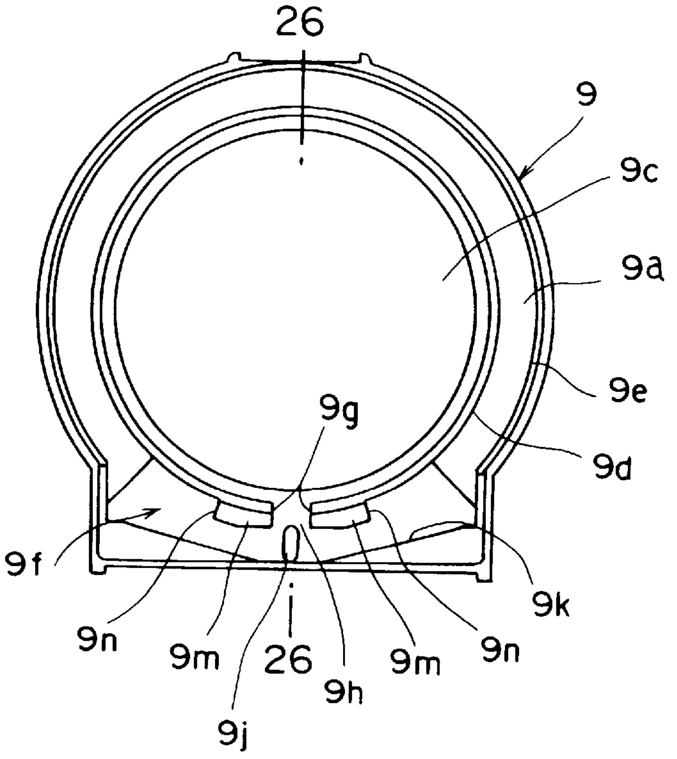
FIG. 24 is a bottom view of the housing.
Figure 25:
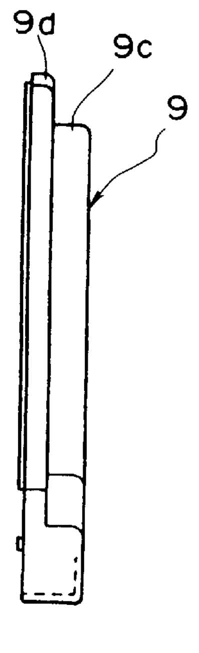
FIG. 25 is a side view of the housing.
Figure 26:
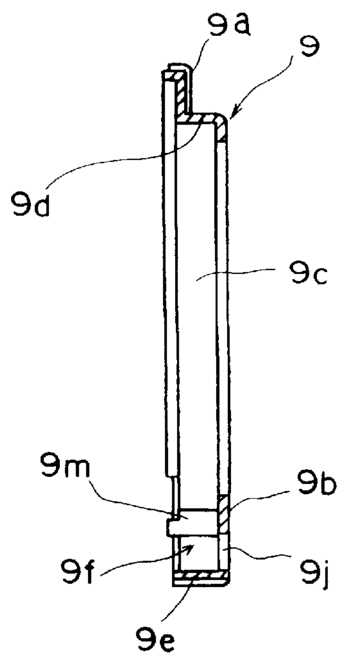
FIG. 26 is a sectional view taken on line 26—26 in FIG. 24.

A rectangular insulating substrate 7 is formed by molding a synthetic resin and, as shown particularly in FIGS. 9, 21, and 22, it has a plurality of holes 7*a*. In the insulating substrate 7 are embedded a plurality of contact pieces 8 having contact portions 8*a* and terminal portions 8*b* and each constituted by a metallic sheet.

As shown particularly in FIG. 4, with the projections 1*h* of the case 1 inserted into the holes 7*a*, the insulating substrate 7 is received in the receptacle portion 1*g* of the case 1 and upper ends of the projections 1*h* are heat-caulked, whereby the substrate 7 is secured to the case 1.

When the insulating substrate 7 is thus secured to the case 1, the contact portions 8*a* contact the conductive pattern 6 and the terminal portions 8*b* are projected to the exterior from the case 1. As the insulating substrate 5 rotates with rotation of the shaft member 2, the conductive pattern 6 comes into and out of contact with plural contact pieces 8 to generate pulses.

The conductive pattern 6 may be formed on the case 1 side and the contact pieces 8 may be provided on the rotary member 3 side.

In this way there is formed a rotary electric part. Although the rotary electric part of this embodiment is shown as an encoder, it may be a variable resistor for example.

As shown particularly in FIG. 9 and FIGS. 23 to 26, a housing 9 formed by molding a synthetic resin and constituting a holding member is substantially the same in shape as the case 1. The housing 9 has an arcuate flat plate-like wall portion 9*a*, a generally rectangular wall portion 9*b* stepped from the wall portion 9*a*, a ring-like inner wall 9*d* erected along an inner periphery of the arcuate wall portion 9*a* and having a through hole 9*c*, and an outer wall 9*e* erected on outer peripheries of the arcuate wall portion 9*a* and the rectangular wall portion 9*b*.

The housing 9 is further provided with a receptacle portion 9*f* formed by being surrounded with the inner and outer walls 9*d*, 9*e* in the position of the rectangular wall portion 9*b*, a recess 9*h* positioned within the receptacle portion 9*f* and having relatively wide side walls 9*g*, the recess 9*h* being formed by cutting off a portion of the concave inner wall 9*d* and by a pair of projections 9*m* which are formed at spaced positions and which constitute a stopper portion, an elongated concave groove 9*j* formed in the rectangular wall portion 9*b* on a line connecting the center of the through hole 9*c* with a middle part of the recess 9*h*, and a chevron-shaped shoulder portion 9*k* formed within the receptacle portion 9*f* and with the groove 9*j* being present at the top of the shoulder portion.

The cylindrical portion of the shaft member 2 is inserted into the central through hole 9*c* of the housing 9 and the shaft member 2 is rotatable with respect to the housing 9.

The following description is now provided about how to assemble the housing 9, the rotor 4 as the rotary member 3 and the insulating substrate 5 relative to the shaft member 2. First, the shaft portion of the shaft member 2 on the side where the first snap leg portions 2*b* are present is inserted into the through hole 9*c* of the housing 9 and the housing is secured to the said shaft portion.

Next, the insulating substrate 5 is superimposed on the flange portion 4*b* of the rotor 4 to constitute the rotary member 3 as a combination of the rotor and the insulating substrate. The shaft portion of the shaft member 2 on the first snap leg portions 2*b* side is then inserted into the cylindrical portion 4*a* of the rotor 4 as a constituent of the rotary member 3.

Further, the first snap leg portions 2*b* of the shaft member 2 pass through the slots 4*e* and are engaged with the insulating substrate 5 (snap-fastened to the side where the conductive pattern 6 is formed). The stepped portions 2*g* of the shaft member 2 come into abutment against the stepped portions 4*g* of the rotor 4 and the rotary member 3 is held grippingly by both stepped portions 2*g* and first snap leg portions 2*b*.

At this time, the housing 9 covers one side of the rotary member 3 and one end of the housing strikes against and is retained by the shoulder portion 2*a* of the shaft member 2, whereby the housing 9 is prevented from coming off the shaft member 2. In this way the housing 9, rotor 4 and insulating substrate 5 are mounted and assembled onto the shaft member 2.

In this assembled state, the flange portion 4*b* and the fan-shaped stopper portion 4*c* of the rotor 4 are lapped on the inner surface of the wall portion 9*a* of the housing 9.

As the rotor is rotated by the shaft member 2 relative to the housing 9 which is in a fixed state, a fan-shaped end of the stopper portion 4*c* strikes against an end 9*n* of a projection 9*m* to stop the rotation of the rotor 4 and of the shaft member 2.

The shaft member 2 with the housing 9, rotor 4 and insulating substrate 5 mounted thereon is fitted on the support portion 1*d* of the case 1 so that the external forms of the arcuate and rectangular wall portions 9*a*, 9*b* of the housing 9 are in conformity with the external forms of the arcuate and rectangular portions of the case 1.

Figure 27:
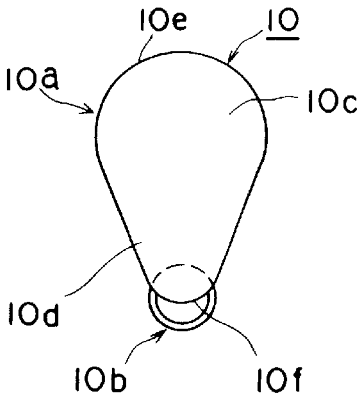
FIG. 27 is a plan view of a click member used in the click structure.
Figure 28:
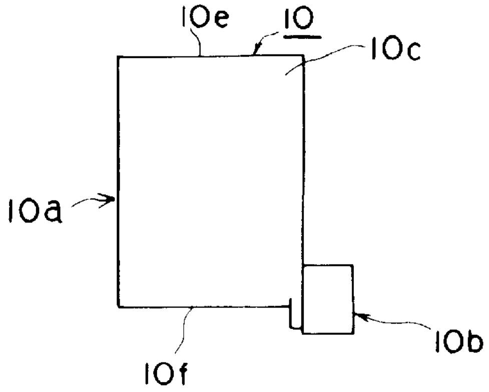
FIG. 28 is a side view of the click member.
Figure 29:
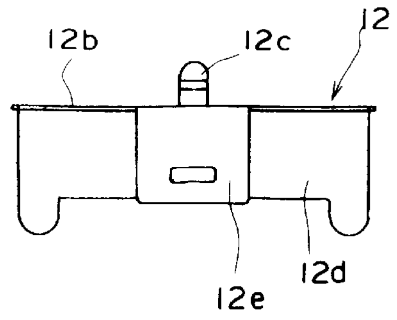
FIG. 29 is a front view of a mounting plate used in the click structure.
Figure 30:
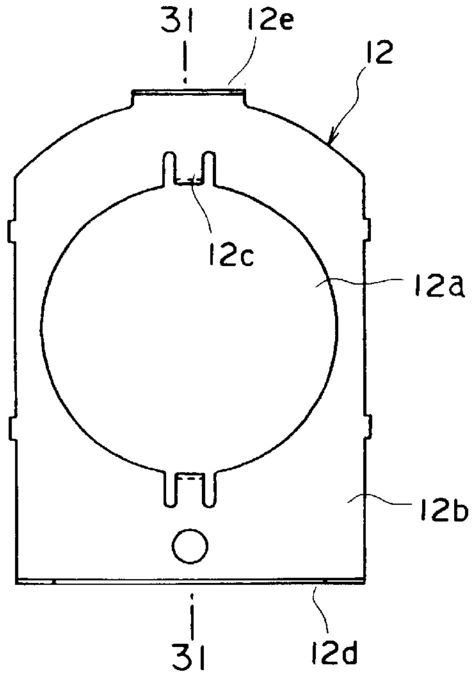
FIG. 30 is a bottom view of the mounting plate.
Figure 31:
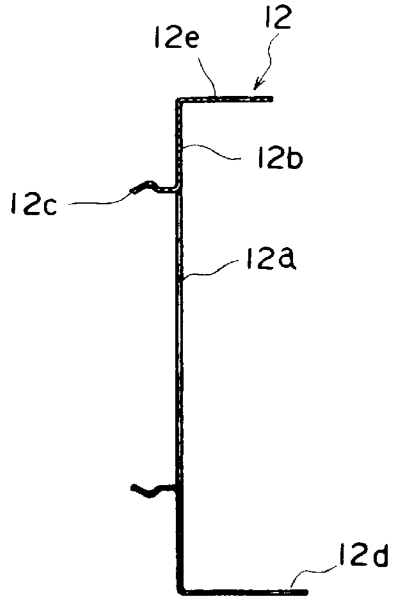
FIG. 31 is a sectional view taken on line 31—31 in FIG. 30.

As shown particularly in FIGS. 27 and 28, a click member 10, which is formed by molding a synthetic resin, comprises a body 10*a* and a convex portion 10*b* formed upright from the body portion 10*a*.

In the body 10*a*, an end of a front portion 10*c* is formed as an arcuate surface 10*e* having a radius larger than that of a rear portion 10*d*, and an end of the rear portion 10*d* is formed as an arcuate surface 10*f* having a radius smaller than that of the front portion 10*c*. The front portion 10*c* is wider than the rear portion 10*d*.

On the rear portion 10*d* side the convex portion 10*b* is projected upright from one side of the body 10*a* so as to partially protrude (overhang) from the end of the rear portion 10*d*.

The click member 10 thus constructed is disposed within the receptacle portion 9*f* of the housing 9 so that the front portion 10*c* is positioned within the recess 9*h* and both sides thereof are supported by the side walls 9*g*. Further, the convex portion 10 is fitted in the groove 9*j*. The click member 10, which is mounted in such a state, is movable radially while being guided by both side walls 9*g* and groove 9*j*.

A biasing member 11 is formed separately from the click member 10, using a spring member such as a metallic plate spring or piano wire. As shown particularly in FIG. 6, the biasing member 11 is disposed in the receptacle portion 9*f* of the housing 9, and with its both end portions abutted against the shoulder portion 9*k*, a central part of the biasing member is in abutment against the arcuate surface 10*f* located at an end of the rear side 10*d* of the click member 10, urging the click member toward the center of the through hole 9*c*.

The front portion 10*c* of the click member 10 attached movably to the housing 9 is brought into elastic pressure contact with the concave-convex portion 4*d* of the rotor 4 by means of the biasing member 11, and with rotation of the rotor 4 the click member 10 is engaged with and disengaged from the concave-convex portion 4*d* and generates a click feeling. Thus, a click mechanism is constituted.

Further, in the click member 10, one side of the body 10*a* is placed on the housing 9 and the flange portion 4*b* of the rotor 4 comes into abutment against a part on the opposite side of the front portion 10*c* of the body 10*a*. Thus, both sides of the click member 10 are held grippingly by the housing 9 and the rotor 4.

As shown particularly in FIG. 9 and FIGS. 29 to 31, a mounting plate 12, which is a metallic plate, comprises a flat plate portion 12*b* having a hole 12*a*, a plurality of mounting legs 12*c* bent from a peripheral edge of the hole 12*a*, a leg portion 12*d* of a large width bent from one end of the flat plate portion 12*b* in the direction opposite to the mounting legs 12*c*, and a leg portion 12*e* of a small width bent from the opposite end of the flat plate portion 12b in the direction opposite to the mounting legs 12*c*.

The flat plate portion 12*b* of the mounting plate 12 is put on the wall portion 1*a* of the case 1, the leg portion 12*d* of a large width is positioned outside the rectangular portion of the case 1, allowing the case 1 and the housing 9 to be embraced by a pair of the leg portions 12*d* and 12*e*, and thereafter tip ends of the leg portions 12*d* and 12*e* are bent at a right angle toward the wall portions 9*a* and 9*b* of the housing 9.

As a result, the housing 9 and the shaft member 2 are mounted to the case 1 by the mounting plate 12.

As shown in FIGS. 4 and 5, the rotary electric part thus constructed is put on a printed circuit board and the convex portion 1*j* of the case 1 is inserted into a hole (not shown) of the printed circuit board, whereby the rotary electric part is established its position relative to the printed circuit board. Further, the terminal portions 8*b* of the contact pieces 8 and the mounting legs 12*c* of the mounting plate 12 are fitted in the printed circuit board and soldered. In this way, mounting of the rotary electric part and wiring are performed for the printed circuit board 13.

On the printed circuit board 13 positioned within the through hole 1*c* of the case 1 is disposed a push-button switch though not shown.

Though not shown, either, a knob is attached to the shaft member 2. With one end of the knob abutted against the shoulder portion 2*a*, the second snap leg portions 2*c* are engaged with the knob, allowing the knob to be held grippingly by both the shoulder portion 2*a* and the second snap leg portions 2*c*.

The operation of the rotary electric part having the above construction will now be described. First, when the shaft member 2 is rotated, it rotates with the support portion 1*d* of the case as a shaft together with the rotor 4 and the insulating substrate 5 as constituents of the rotary member 3.

With rotation of the rotor 4, the front portion of the click member 10 positioned in a valley of the concave-convex portion 4*d* is pushed out backward by a crest of the concave-convex portion 4*d* against the resilience of the biasing member 11.

Figure 7:
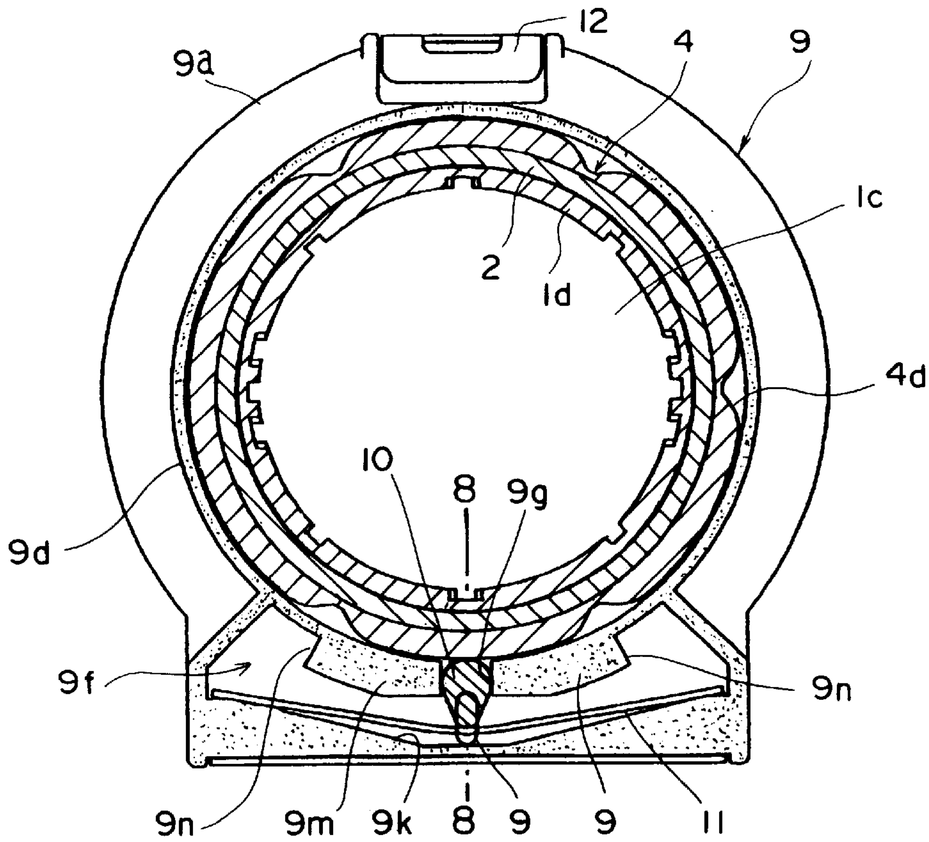
FIG. 7 is an explanatory diagram illustrating the operation of the click structure.
Figure 8:
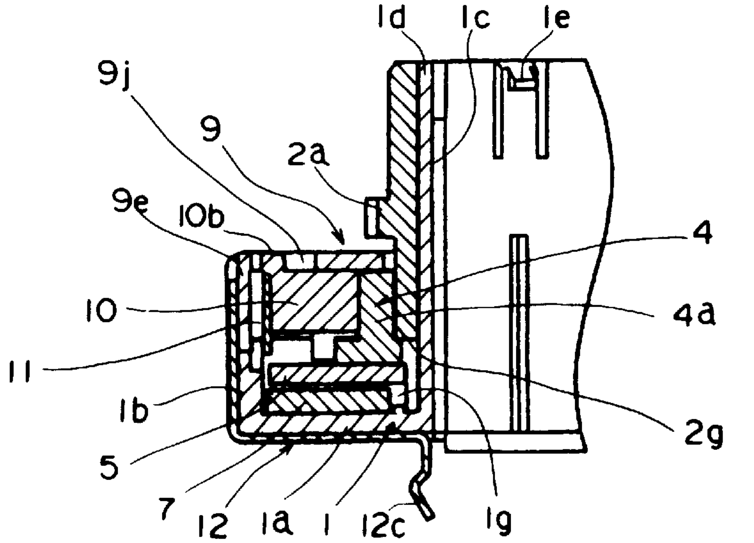
FIG. 8 is a sectional view taken on line 8—8 in FIG. 7.

At this time, the front portion 10*c* of the click member 10 is guided by the side walls 9*g* of the recess 9*h*, while the convex portion 10*b* is guided by the groove 9*j*, and the click member 10 moves radially, as shown in FIGS. 7 and 8.

During this radial movement the click member 10 does not wobble so much in the circumferential direction (rotational direction) because it is supported by the side walls 9*g* and the groove 9*j*.

With a further rotation of the shaft member 2, the click member 10 falls into a valley of the concave-convex portion 4*d*. In this way the click member 10 is engaged with and disengaged from the concave-convex portion 4*d*, so that the rotation of the shaft member 2 is given a click feeling.

In this embodiment, since the arcuate surface 10*f* against which the biasing member 11 comes into abutment is disposed between a rear end of the convex portion 10*b* and the front portion 10*c*, the click member 10 is difficult to tilt and can be moved radially in a stable manner. Besides, since the biasing member 11 can be disposed at a position close to the center, its radial size can be reduced.

The rotation of the shaft member 2 is stopped upon abutment of the stopper portion 4*c* of the rotor 4 against the ends 9*n* of the projections 9*m* of the housing 9. As the shaft member 2 rotates, the conductive pattern 6 also rotates together with the insulating substrate 5, whereby the contact pieces 8 come into and out of contact with the conductive pattern 6 and generate pulses.

As a result, the temperature of an air conditioner or air volume is adjusted.

Although in the above embodiment the concave-convex portion 4*d* of the rotor 4 is formed on the outer circumference portion (a surface parallel to the axial direction), there may be adopted a modification wherein the concave-convex portion 4*d* is formed on a surface perpendicular to the axial direction of the rotor 4 and the click member 10 is pressed elastically by the biasing member 11 so as to become engaged with and disengaged from the concave-convex portion 4*d*.

Although in the above embodiment the click member 10 is held by a single holding member 9, it may be held by two holding members 9.

In the rotary electric part of the present invention, since the click member 10 and the biasing member 11 are formed as separate members, there is no fear that the resilience of the biasing member may be affected by the heat generated during molding. Besides, the spring span of the biasing member 11 can be made longer than in the prior art and thus a satisfactory resilience is ensured over a long period.

Since the body 10*a* of the click member 10 is guided by the side walls 9*g* of the recess 9*h* formed in the holding member 9 and the convex portion 10*b* moves while being guided by the concave groove 9*j*, the click member 10 is guided at two positions during its movement and hence it wobbles less in the circumferential direction (rotational direction) than in the prior art, affording a good click feeling.

Since the convex portion 10*b* of the click member 10 is formed at the rear portion 10*d* of the body on the side opposite to the front portion 10*c* of the body which engages and disengages from the concave-convex portion 4*d*, it is possible to take long the distance between the front portion 10*c* supported by the side walls 9*g* and the convex portion 10*b* supported by the groove 9*j*, so that that the click member 10 wobbles less and can move stably.

Since the convex portion 10*b* of the click member 10 is formed so that at least a part thereof projects from an end of the rear portion 10*d* of the body 1*a*, the distance between the front portion 10*c* supported by the side walls 9*g* and the convex portion 10*b* supported by the groove 9*j* can be made longer, so that the click member 10 wobbles less and can move stably.

Further, in the click member 10, the front portion 10*c* of the body 10*a* is formed wider than the rear portion 10*d* and is guided by the side walls 9*g* of the recess 9*h*, and the an end of the rear portion smaller in width is urged by the biasing member 11. Consequently, the area of sliding contact of the body 10*a* with the side walls 9*g* can be reduced. Even when the click member 10 tilts, it can move smoothly without being caught on the side walls 9*g*.

Since an end of the front portion 10*c* of the body 10*a* is formed as an arcuate surface 10*e* larger in radius than the rear portion 10*d* and an end of the rear portion 10*d* is formed as an arcuate surface 10*f* smaller in radius than the front portion 10*c*, the front arcuate surface 10*e* can be smoothly engaged with and disengaged from the concave-convex portion 4*d* and the area of contact of the rear arcuate surface 10*f* with the biasing member 11 can be made small, so that the click member 10 can be urged uniformly by the biasing member 11, affording a stable click feeling.

Since the holding member 9 is formed of synthetic resin and the metallic biasing member 11 is held by the resinous holding member 9, the noise caused by sliding and vibration of the biasing member 11 relative to the holding member 9 at the time of clicking is extremely low.

Further, since the click member 10 is formed of synthetic resin, the rotary member 3 can be smoothly engaged with and disengaged from the concave-convex portion 4*d*, affording a good click feeling.

Since the biasing member 11 is formed by a metallic plate spring, a push-in work can be done by utilizing the width of the plate spring, so that the work for acommodating the biasing member 11 into the holding member 9 becomes easier and there can be attained a superior asemblability.

Further, the concave-convex portion 4d is formed on the outer circumference of the rotary member 3, the holding member 9 is constituted by the housing, and the click member 10 is held grippingly between the housing and the rotary member 3. Consequently, the click member 10 can be held firmly and can move stably.

What is claimed is:

1. A rotary electric part comprising:

a rotary member having a plurality of concaves and convexes;

a click member for engagement with and disengagement from the concaves and convexes;

a biasing member for urging the click member elastically in a direction in which the click member comes into pressure contact with the concaves and convexes; and a holding member for holding the biasing member, the click member coming into engagement with and disengagement from the concaves and convexes with rotation of the rotary member and creating a click feeling, wherein the click member and the biasing member are formed as separate members, the click member has a body for engagement with and disengagement from the concaves and convexes and also has a convex portion which is integral with the body in a direction perpendicular to a moving direction of the body, the body of the click member is guided by side walls of a concave portion formed in the holding member, and the convex portion is guided by a concave groove.

2. A rotary electric part according to claim 1, wherein the convex portion of the click member is formed at a rear portion of the body on the side opposite to a front portion of the body which comes into engagement with and disengagement from the concaves and convexes.

3. A rotary electric part according to claim 2, wherein the convex portion of the click member is formed so as to project at least partially from an end of the rear portion of the body.

4. A rotary electric part according to claim 2, wherein the front portion of the body of the click member is formed to have a width larger than the width of the rear portion of the body and is guided by the side walls of the concave portion, and an end of the rear portion smaller in width is urged by the biasing member.

5. A rotary electric part according to claim 4, wherein an end of the front portion of the body in the click member is formed as an arcuate surface having a radius larger than that of the rear portion of the body, while an end of the rear portion is formed as an arcuate surface having a radius smaller than that of the front portion.

6. A rotary electric part according to claim 1, wherein the click member and the holding member are formed of synthetic resin.

7. A rotary electric part according to claim 1, wherein the biasing member is formed by a metallic plate spring.

8. A rotary electric part according to claim 1, wherein the concaves and convexes are formed on an outer circumference portion of the rotary member, the holding member is constituted by a housing, and the click member is held grippingly between the housing and the rotary member.

* * * * *